(12) United States Patent
Yamazaki (10) Patent No.: US 6,230,650 B1
(45) Date of Patent: *May 15, 2001

(54) MICROWAVE ENHANCED CVD SYSTEM UNDER MAGNETIC FIELD

(75) Inventor: Shunpei Yamazaki, Tokyo (JP)

(73) Assignee: Semiconductor Energy Laboratory Co., Ltd., Kanagawa-Ken (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/814,993

(22) Filed: Mar. 14, 1997

Related U.S. Application Data (62) Division of application No. 08/216,438, filed on Mar. 23, 1994, which is a division of application No. 07/776,058, filed on Sep. 25, 1991, now abandoned, which is a continuation-in-part of application No. 07/355,863, filed on May 18, 1989, which is a continuation of application No. 06/918,075, filed on Oct. 14, 1986, now abandoned, which is a continuation-in-part of application No. 06/911,088, filed on Sep. 24, 1986, now abandoned.

(30) Foreign Application Priority Data

| Oct. 14, 1985 | (JP) | 60-228077 |
| Oct. 14, 1985 | (JP) | 60-228078 |
| Oct. 14, 1985 | (JP) | 60-228080 |
| Oct. 14, 1985 | (JP) | 60-228082 |
| Oct. 14, 1985 | (JP) | 60-228083 |

(51) Int. Cl.$^7$ ............ C23C 16/00; C03C 15/00
(52) U.S. Cl. ............ 118/723 ME; 156/345; 427/569; 216/69; 438/727
(58) Field of Search ............ 118/723 MW, 118/723 ME, 723 MR, 723 MA; 156/345; 204/298.16, 298.37; 315/111.41; 438/710, 726, 727, 728, 732, 758; 427/569, 570, 571, 572; 216/67, 69, 70

(56) References Cited

U.S. PATENT DOCUMENTS

| 3,228,812 | 1/1966 | Blake | 427/93 X |
| 3,338,209 | 8/1967 | Bhola | 118/49.5 |

(List continued on next page.)

FOREIGN PATENT DOCUMENTS

| 31 44016 A1 | 7/1982 | (DE) | 118/723 MR |
| 2397067 | 2/1979 | (FR) . | |

(List continued on next page.)

OTHER PUBLICATIONS

Brunshah, R., et al.,Deposition Technologies for Films and Coatings, Noyes Publications, 1982, pp. 376–377.

(List continued on next page.)

*Primary Examiner*—Gregory Mills
*Assistant Examiner*—Luz Alejandro
(74) *Attorney, Agent, or Firm*—Nixon Peabody LLP; Jeffrey L. Costellia (57) ABSTRACT

An improved chemical vapor deposition or etching is shown in which cyclotron resonance and photo or plasma CVD cooperate to deposit a layer with high performance at a high deposition speed. The high deposition speed is attributed to the cyclotron resonance while the high performance is attributed to the CVDS.

37 Claims, 3 Drawing Sheets

U.S. PATENT DOCUMENTS

| | | |
|---|---|---|
| 3,404,661 | 10/1968 | Mathias et al. . |
| 3,485,666 | 12/1969 | Sterling et al. ............................ 427/37 |
| 3,627,590 | 12/1971 | Mammel . |
| 3,644,931 | 2/1972 | Stinger et al. . |
| 3,661,637 | 5/1972 | Sirtl . |
| 3,785,853 | 1/1974 | Kirkman et al. . |
| 4,006,340 | 2/1977 | Gorinas ............................ 219/121 P |
| 4,088,456 | 5/1978 | Giorgi et al. ............................ 55/179 |
| 4,123,316 | 10/1978 | Tsuchimoto ............................ 156/643 |
| 4,138,306 | 2/1979 | Niwa . |
| 4,141,811 | 2/1979 | Yerkes et al. . |
| 4,171,235 | 10/1979 | Fraas et al. . |
| 4,183,780 | 1/1980 | McKenna ............................ 427/38 |
| 4,223,048 | 9/1980 | Engle ............................ 427/39 |
| 4,226,208 | 10/1980 | Nishida et al. . |
| 4,262,631 | 4/1981 | Kubacki . |
| 4,282,267 | 8/1981 | Küyel ............................ 427/38 |
| 4,298,419 | 11/1981 | Suzuki et al. . |
| 4,317,844 | 3/1982 | Carlson . |
| 4,330,384 | 5/1982 | Okudaira et al. . |
| 4,330,570 | 5/1982 | Giuliani et al. ............................ 427/64 |
| 4,332,522 | 6/1982 | Saulgeot ............................ 415/90 |
| 4,363,828 | 12/1982 | Brodsky et al. . |
| 4,365,107 | 12/1982 | Yamauchi ............................ 427/39 |
| 4,401,054 | 8/1983 | Matsuo et al. . |
| 4,402,997 | 9/1983 | Hogan et al. ............................ 118/71.5 |
| 4,421,592 | 12/1983 | Shuskus et al. . |
| 4,435,445 | 3/1984 | Allred ............................ 427/54.1 |
| 4,438,368 | 3/1984 | Abe ............................ 315/39 |
| 4,438,723 | 3/1984 | Cannella et al. . |
| 4,451,503 | 5/1984 | Blum et al. ............................ 427/53.1 |
| 4,461,783 | 7/1984 | Yamazaki . |
| 4,481,229 | 11/1984 | Suzuki ............................ 427/47 |
| 4,485,125 | 11/1984 | Izu et al. . |
| 4,492,716 | 1/1985 | Yamazaki . |
| 4,496,423 | 1/1985 | Walton ............................ 156/345 |
| 4,503,807 | 3/1985 | Nakayama et al. . |
| 4,509,451 | 4/1985 | Collins et al. ............................ 427/39 |
| 4,515,107 | 5/1985 | Fournier et al. . |
| 4,522,663 | 6/1985 | Ovshinsky ............................ 427/39 |
| 4,522,674 | 6/1985 | Ninomiya ............................ 156/345 |
| 4,525,382 | 6/1985 | Sugioka . |
| 4,529,474 | 7/1985 | Fujiyama et al. . |
| 4,529,475 | 7/1985 | Okano et al. ............................ 156/643 |
| 4,530,818 | 7/1985 | Gutermann ............................ 422/240 |
| 4,532,022 | 7/1985 | Takasaki et al. ............................ 427/39 |
| 4,532,196 | 7/1985 | Yasui et al. ............................ 430/31 |
| 4,532,199 | 7/1985 | Ueno ............................ 427/39 |
| 4,534,816 | 8/1985 | Chen et al. . |
| 4,537,795 | 8/1985 | Nath et al. . |
| 4,539,068 | 9/1985 | Takagi et al. ............................ 427/39 |
| 4,543,465 | 9/1985 | Sakudo ............................ 219/121 PD |
| 4,544,423 | 10/1985 | Tsuge et al. . |
| 4,550,684 | 11/1985 | Mahawili . |
| 4,564,997 | 1/1986 | Matsuo ............................ 427/47 |
| 4,568,565 | 2/1986 | Gupta et al. ............................ 427/255.2 |
| 4,576,698 | 3/1986 | Gallagher et al. . |
| 4,581,100 | 4/1986 | Hatzakis et al. ............................ 156/643 |
| 4,582,720 | 4/1986 | Yamazaki . |
| 4,585,541 | 4/1986 | Miyake ............................ 204/298 |
| 4,592,306 | 6/1986 | Gallego . |
| 4,598,665 | 7/1986 | Tanaka ............................ 118/715 |
| 4,608,117 | 8/1986 | Ehrlich et al. ............................ 427/53.1 |
| 4,613,400 | 9/1986 | Tam et al. . |
| 4,615,298 | 10/1986 | Yamazaki ............................ 118/723 |
| 4,624,736 | 11/1986 | Gee ............................ 118/728 |
| 4,625,678 | 12/1986 | Shioya et al. . |
| 4,629,635 | 12/1986 | Brors . |
| 4,636,401 | 1/1987 | Yamazaki ............................ 118/723 |
| 4,645,684 | 2/1987 | Osada ............................ 427/38 |
| 4,654,226 | 3/1987 | Jackson et al. ............................ 427/54.1 |
| 4,657,616 | 4/1987 | Benzing et al. . |
| 4,664,769 | 5/1987 | Cuomo et al. . |
| 4,664,938 | 5/1987 | Walker ............................ 118/723 MP X |
| 4,668,365 | 5/1987 | Foster ............................ 427/47 |
| 4,681,653 | 7/1987 | Purdes et al. ............................ 427/39 |
| 4,683,838 | 8/1987 | Kimura ............................ 118/715 |
| 4,687,544 | 8/1987 | Bersin ............................ 156/345 |
| 4,693,211 | 9/1987 | Ogami et al. . |
| 4,695,331 | 9/1987 | Romaprasud ............................ 427/54.1 |
| 4,695,700 | 9/1987 | Provence et al. . |
| 4,699,805 | 10/1987 | Seelbach et al. ............................ 118/71.5 |
| 4,702,934 | 10/1987 | Ishihara et al. ............................ 427/39 |
| 4,713,258 | 12/1987 | Umemura ............................ 427/35 |
| 4,726,963 | 2/1988 | Ishihara ............................ 427/53.1 |
| 4,728,528 | 3/1988 | Ishihara et al. ............................ 427/53.1 |
| 4,745,088 | 5/1988 | Inoue et al. . |
| 4,747,368 | 5/1988 | Brien et al. . |
| 4,759,947 | 7/1988 | Ishihara et al. ............................ 427/53.1 |
| 4,767,641 | 8/1988 | Kieser et al. . |
| 4,798,166 | 1/1989 | Hirooka et al. . |
| 4,800,174 | 1/1989 | Ishihara et al. . |
| 4,808,553 | 2/1989 | Yamazaki . |
| 4,811,684 | 3/1989 | Tashiro ............................ 118/50.1 |
| 4,825,808 | 5/1989 | Takahashi et al. . |
| 4,828,369 | 5/1989 | Hotomi ............................ 350/357 |
| 4,883,560 | 11/1989 | Ishihara ............................ 118/723 MP |
| 4,909,914 | 3/1990 | Chiba ............................ 204/164 |
| 4,913,929 | 4/1990 | Moslehi ............................ 427/39 |
| 4,915,979 | 4/1990 | Ishida ............................ 118/723 |
| 4,919,077 | 4/1990 | Oda et al. ............................ 118/723 MP |
| 4,947,085 | 8/1990 | Nakanishi ............................ 315/111.41 |
| 4,951,601 | 8/1990 | Maydan et al. . |
| 4,960,488 | 10/1990 | Law et al. . |
| 4,982,138 | 1/1991 | Fujiwara ............................ 315/11.41 |
| 5,000,113 | 3/1991 | Wang et al. . |
| 5,034,086 | 7/1991 | Sato ............................ 156/345 |
| 5,081,398 | 1/1992 | Asmussen ............................ 314/111.41 |
| 5,110,619 | 5/1992 | Ogumi et al. ............................ 118/723 |
| 5,158,644 | 10/1992 | Cheung et al. . |
| 5,211,825 | 5/1993 | Saito ............................ 204/298.32 |
| 5,230,931 | 7/1993 | Yamazaki ............................ 427/569 |
| 5,283,087 | 2/1994 | Yamazaki ............................ 427/577 |
| 5,449,411 | 9/1995 | Fukuda et al. . |
| 5,487,787 | 1/1996 | Cann ............................ 118/723 R |
| 5,503,676 | 4/1996 | Shufflebotham ............................ 118/723 MR |
| 5,512,102 | 4/1996 | Yamazaki . |

FOREIGN PATENT DOCUMENTS

| | | |
|---|---|---|
| 1151746 | 5/1969 | (GB) . |
| 2 119 406 | 11/1983 | (GB) . |
| 43-29256 | 12/1943 | (JP) . |
| 60-224216 | 11/1960 | (JP) . |
| 1-275761 | 11/1969 | (JP) ............................ 118/723 |
| 50-9545 | 4/1975 | (JP) . |
| 51-112182 | 10/1976 | (JP) . |
| 55-6410 | 1/1980 | (JP) . |
| 55-21553 | 2/1980 | (JP) . |
| 55-34690 | 3/1980 | (JP) . |
| 55-78524 | 6/1980 | (JP) . |
| 55-105332 | 8/1980 | (JP) . |
| 57-39430 | 8/1980 | (JP) . |
| 55-141570 | 11/1980 | (JP) . |
| 56-28637 | 3/1981 | (JP) . |
| 56-102577 | 8/1981 | (JP) . |
| 56-110236 | 9/1981 | (JP) . |
| 56-152738 | 11/1981 | (JP) . |
| 56-155535 | 12/1981 | (JP) . |
| 57-149748 | 9/1982 | (JP) . |
| 57-167631 | 10/1982 | (JP) . |
| 57-201016 | 12/1982 | (JP) . |

| | | | |
|---|---|---|---|
| 58-25226 | 2/1983 | (JP) . | |
| 58-92217 | 6/1983 | (JP) . | |
| 58-92218 | 6/1983 | (JP) . | |
| 58-93321 | 6/1983 | (JP) . | |
| 58-95550 | 6/1983 | (JP) . | |
| 58-167766 | 10/1983 | (JP) . | |
| 58-173826 | 10/1983 | (JP) . | |
| 58-196063 | 11/1983 | (JP) . | |
| 59-016328 | 1/1984 | (JP) . | |
| 59-45907 | 3/1984 | (JP) . | |
| 59-52833 | 3/1984 | (JP) . | |
| 59-52834 | 3/1984 | (JP) . | |
| 59-56725 | 4/1984 | (JP) . | |
| 59-129772 | 7/1984 | (JP) . | |
| 59-145779 | 8/1984 | (JP) . | |
| 59-145780 | 8/1984 | (JP) . | |
| 59-216625 | 12/1984 | (JP) . | |
| 60-033300 | 2/1985 | (JP) . | |
| 60-103099 | 6/1985 | (JP) . | |
| 60-117712 | 6/1985 | (JP) . | |
| 60-138909 | 7/1985 | (JP) | H01L/21/205 |
| 60-167318 | 8/1985 | (JP) . | |
| 60-170234 | 9/1985 | (JP) . | |
| 60-180999 | 9/1985 | (JP) | 423/466 |
| 60-194060 | 10/1985 | (JP) . | |
| 60-224215 | 11/1985 | (JP) . | |
| 60-245217 | 12/1985 | (JP) | 118/723 MP |
| 61-032511 | 2/1986 | (JP) . | |
| 61-53719 | 3/1986 | (JP) . | |
| 61-99682 | 6/1986 | (JP) . | |
| 61-143579 | 7/1986 | (JP) . | |
| 61-166975 | 7/1986 | (JP) . | |
| 61-199626 | 9/1986 | (JP) . | |
| 61-248420 | 11/1986 | (JP) . | |
| 61-276977 | 12/1986 | (JP) . | |
| 62-27575 | 2/1987 | (JP) . | |
| 62-60876 | 3/1987 | (JP) . | |
| 62-089874 | 4/1987 | (JP) . | |
| 62-089875 | 4/1987 | (JP) . | |
| 62-089876 | 4/1987 | (JP) . | |
| 62-86165 | 4/1987 | (JP) . | |
| 62-89882 | 4/1987 | (JP) . | |
| 62-112318 | 5/1987 | (JP) . | |
| 62-118520 | 5/1987 | (JP) . | |
| 62-118521 | 5/1987 | (JP) . | |
| 62-120477 | 6/1987 | (JP) . | |
| 62-143418 | 6/1987 | (JP) . | |
| 62-037527 | 8/1987 | (JP) . | |
| 62-37527 | 8/1987 | (JP) . | |
| 62-224923 | 10/1987 | (JP) . | |
| 2-232372 | 9/1990 | (JP) | 118/723 MP |
| 86-06687 | 11/1986 | (WO) . | |
| 87-07309 | 12/1987 | (WO) . | |

OTHER PUBLICATIONS

Outlaw, R., Ultrahigh Vacuum Produced By A Combination of Turbomolecular And Titanium Sublimation Pumping, Journal of Vacuum Science & Technology, vol. 3, No. 6, pp. 352–354, Nov./Dec. 1966.

Dylla, H., Turbomolecular pump vacuum system for the Princeton Large Torus, Journal of Vacuum Science & Technology, vol. 15, No. 2, pp. 734–740, Mar./Apr. 1978.

Weil, R., et al., Glow–Discharge a⁻Si:F Prepared from $SiF_2$ Gas, Journal De Physiquevol. C4, Suppl. 10, 10–81, pp. 643–646, Oct. 1981.

Matsuo, S., et al., Low Temperature Chemical Vapor Deposition Method Utilizing an Electron Cyclotron Resonance Plasma, Japanese Journal of Applied Physics, vol. 22, No. 4, Apr. 1983, pp. L210–L212.

Maissel, L., et al., Handbook of Thin Film Technology, 1970, pp. 204, 2–9.

Wolf, Silicon Processing For The VLSI Era, vol. 2, Process Integration, pp. 237–238, No Date Available.

O'Hanlon, John F., "A User's Guide to Vacuum Technology", 1980.

Brodsky et al., Method of Preparing Hydrogenated Amorphous Silicon, IBM Technical Disclosure Bulletin, vol. 22, No. 8A PG 3391–3392, Jan. 1980.

Webster's New World Dictionary, Third College Edition, 1988, p. 707.

High–Conductive Wide Band Gap P–Type a: S:C:H Prepared by ECR CVD and its Application to High Efficiency a–S; Basis Solar Cells, Y. Hattori et al., Presented at 19th IEEE PVSC (New Orleans) May 4–8, 1987, pp. 1–6.

"Reactive Ion Beam Etching Using a Broad Beam ECR Ion Source", S. Matsuo and Y. Adachi, Japanese Journal of Applied Physics, vol. 21, No. 1, Jan., 1982, pp. L4–L6.

MICROWAVE ENHANCED CVD SYSTEM UNDER MAGNETIC FIELD

This is a Divisional Application of Ser. No. 08/216,438, filed Mar. 23, 1994; which itself is a division of Ser. No. 07/776,058, filed Sep. 25, 1991 (now abandoned); which in turn was a continuation-in-part Ser. No. 07/355,863, filed May 18, 1989, which is a continuation of Ser. No. 06/918,075, filed Oct. 14, 1986 (now abandoned), which in turn was a continuation-in-part of Ser. No. 06/911,088, filed Sep. 24, 1986 (now abandoned).

BACKGROUND OF THE INVENTION

This invention relates to a microwave enhanced CVD system under magnetic field, more particularly to an ECR (Electron Cyclotron Resonance) CVD (Chemical Vapor Deposition) system.

In the field of thin film formation techniques, there is a known photo enhanced chemical vapor deposition which is advantageous, compared with conventional CVDs such as a thermal CVD, or plasma enhanced CVD, in that a deposition can be carried out at relatively low temperature without injuring the surface on which a layer should be formed. The photo enhanced CVD has a further advantage of "wandering on a surface". Namely, atoms or molecules of the deposited layer preserve their active energy after being deposited on a surface of a substrate, and due to the active energy they move and also form a layer on a surface on which no deposition is carried out, thereby on an uneven surface is established a layer formation with an improved step coverage by CVD.

The photo CVD, however, is far short of carrying out deposition of a layer at high speed which is required from the commercial interest. It has therefore been desired to increase the deposition speed by a factor of tens.

On the other hand, a plasma CVD is known which utilizes glow discharge by means of high frequency or DC power supply to make a process gas plasma. This technique is advantageous in capability of relatively low temperature deposition. Especially, when an amorphous silicon layer is to be deposited, doping of hydrogen or halogen can be simultaneously carried out in order to neutralize recombination centers on the layer so that p-i-n or p-n junctions are easily obtained with improved characteristics. Such a plasma CVD also sufficiently copes with the demands of fast deposition.

Further, a CVD with Electron Cyclotron Resonance (ECR) has been known according to which a thick layer of 5000 Å to 10 microns in thickness can be deposited at 10 Å to 100 Å per second. However, a reactant gas moves in parallel to the surface of a substrate making it impossible to form a layer on a depression such as a trench. In addition to this, argon atoms resonate at 2.46 GHz which requires a strong magnetic field of 875 Gauss, therefore requiring a very large coreless coil. As a result, due to the limited space available for exciting gas, a standard of fluctuation of 10% in thickness might be compromised even on a 3 inch disc wafer.

SUMMARY OF THE INVENTION

It is therefore an object of the present invention to provide an improved chemical vapor deposition or etching system and process with a high deposition speed while not compromising the performance of the characteristics of a layer deposited.

DETAILED DESCRIPTION OF PREFERRED EMBODIMENTS OF THE INVENTION

According to the invention, reactive gas is energized mainly by means of cyclotron resonance. The energized gas spreads in a reaction space in which a chemical reaction is set on process gas to carry out deposition of a layer. The invention takes the advantages of both an ECR CVD and Photo enhanced or glow discharge CVDs; the ECR CVD is superior in high deposition speed while the glow discharge and photo enhanced CVDs are superior in uniformity of a layer deposited. For example, when amorphous silicon layers are deposited by glow discharge and photo enhanced CVD, the deposition speeds are 1 Å/min and 0.1 Å/min respectively.

The glow discharge CVD and the photo enhanced CVD are used together with a ECR CVD. This combination makes it possible to deposit a layer at a very high deposition speed without compromising uniformity of the layer. In the case of deposition of an amorphous silicon layer, the deposition speed is 5 to 20 Å/min in cooperation with a photo enhanced CVD and is 20 to 100 Å/min in cooperation with a glow discharge CVD.

The cyclotron resonance is carried out, in preferred embodiments, with inert gas or nonproductive gas which can not produce any solid state material even after reaction or decomposition. Argon gas is used in general for this purpose. However, helium, neon or krypton may be used. Also the nonproductive gas may be an oxide gas such as oxygen, nitrogen oxide ($N_2O$, $NO$, $NO_2$), carbon oxide ($CO, CO_2$), water ($H_2O$) or a nitride such as nitrogen, ammonia, hydrazine ($N_2H_4$) or nitrogen fluoride ($NF_3$, $N_2F_6$) or mixture thereof diluted with a carrier gas or hydrogen gas.

As a productive gas which produces solid material to be deposited by virtue of a chemical reaction or a decomposition, silicide gas such as $Si_nH_{2n+2}$ ($n \geq 1$), SiFn ($n \geq 2$), $SiH_nF_{4-n}$ ($4 \geq n \geq 1$), germanium compounds such as $GeH_4$, $GeF_4$, $GeH_nF_{4-n}$ (n=1,2,3), aluminum compound such as $Al(CH_3)_3$, $Al(C_2H_5)_3$, $AlCl_3$ or gallium compounds such as $Ga(CH_3)_3$ and $Ga(C_2H_5)_3$ is introduced into the reaction space. In addition to this, a doping gas such as $B_2H_6$, $BF_3$, $PH_3$ or $AsH_3$ may be mixed with the nonproductive gas.

The nonproductive gas is made active by cyclotron resonance and introduced into the reaction space in which it is mixed with and renders energy to the productive gas. In the process, the productive gas is sufficiently excited to almost 100% of the necessary energy. The energy of the productive gas is "latent" and spreads throughout the reactive space in which glow discharge or ultraviolet light exist. Under this atmosphere the deposition is carried out at room temperature or less than 500° C.

In case of a system according to the invention equipped with a photo enhanbed CVD, deposition can be formed even on the inside of a deep trench. An experiment demonstrated deposition of a layer of 0.5 microns in thickness on a level surface and 0.3 to 0.45 microns on the inside of the trench, the trench having an opening of 1 micron in diameter and is 4 microns in depth.

Furthermore, when a semiconductor layer is deposited on a conductive transparent film having a texture structure to form a solar cell, the semiconductor layer can be formed with the opposed surfaces both being uneven according to the invention. This layer formation configuration, which is advantageous to increase the conversion efficiency of a solar cell, is attributed to the characteristics of ECR.

Figure 1:
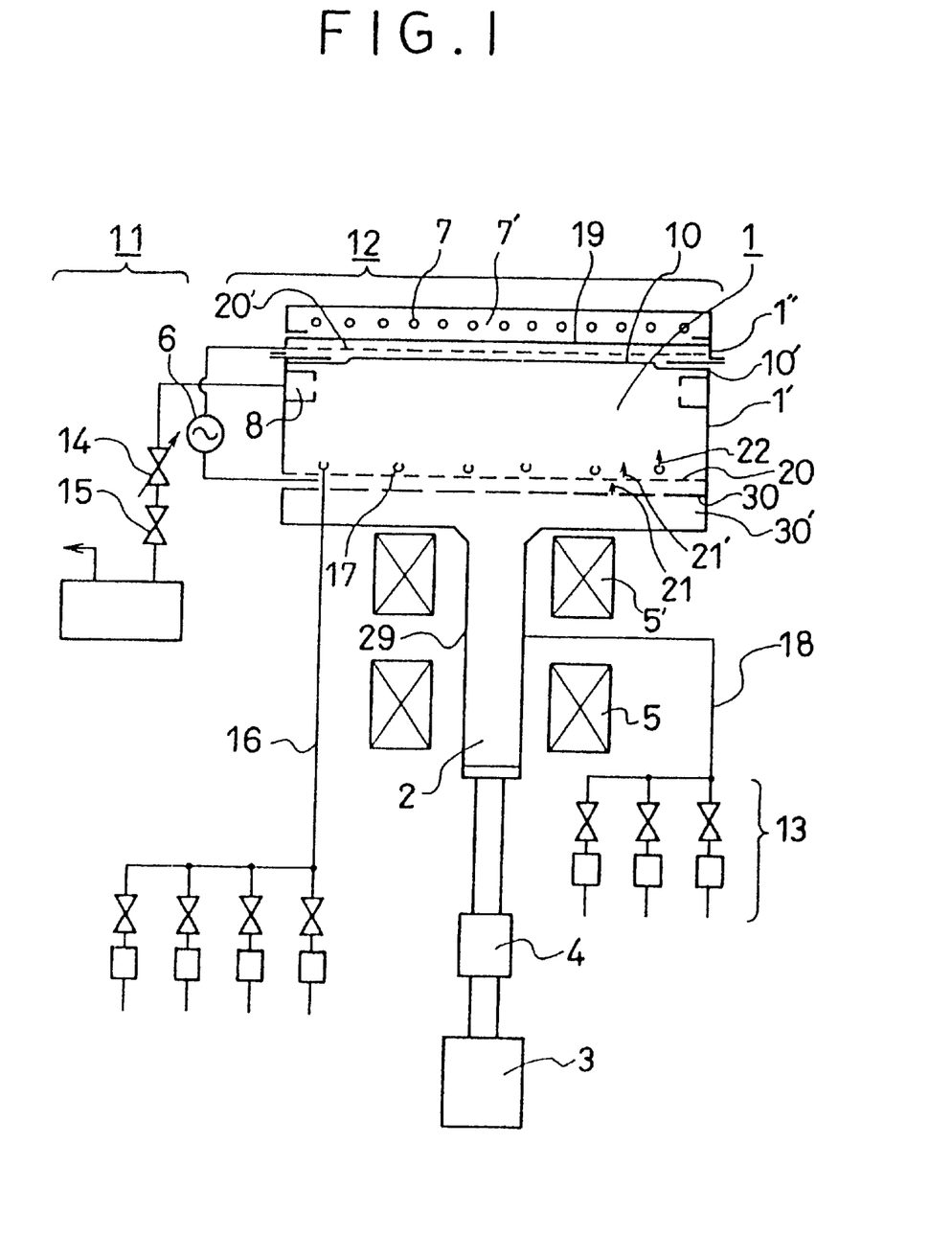
FIG. 1 is a side elevational, partial sectioned view showing a first embodiment on the invention.

Referring now to FIG. 1, a plasma CVD system 12 equipped with a cyclotron resonance device according to the invention is schematically illustrated as a first embodiment.

The system 12 includes a reaction chamber 1' made of stainless steel having a closure 1" in which is defined a reaction space 1. On an upper portion of the reaction chamber 1' are formed holders 10' by which a substrate 10 is held inside the chamber 1'. A halogen lamp heater 7' having a number of halogen lamps 7 is provided on the closure 1". An access to the substrate 10 is available when the closure 1" is removed from the chamber 1'. The halogen lamp heater 7' irradiates the substrate 10 from the upper side through a window 19 made of artificial quartz. Further provided are a pair of mesh grids 20 and 20' which, one being between the heater 7' and the substrate 10, the other being near the bottom of the chamber 1'. A high frequency voltage of 13.56 MHz or a DC voltage is applied to the grids 20 and 20' from a power source 6. By virtue of the glow discharge between the grid, the reaction space comes to hold plasma gas therein. The substrate 10 is subjected to the glow discharge caused by the electric field produced between the grids 20 and 20'.

On the other hand, a nonproductive gas is supplied from a doping system 13 to a resonating space confined by an artificial quartz cylinder 29 through a conduit 18. A magnetic field is applied to the resonating space 2 by means of core-less coils 5, 5' provided on the outside of the cylinder 29. Simultaneously, microwaves of 2.45 GHz are emitted into the resonating space from a microwave oscillator 3 through an isolator 4. The density of the magnetic field to be supplied is determined in correspondence with the molecular weight of the nonproductive gas. The frequency of the microwaves is automatically determined corresponding to the magnetic field. For example, where the nonproductive gas is argon gas, the magnetic field is adjusted at 875 Gauss.

By virtue of the magnetic field and the microwaves, the nonproductive gas is pinched and energized as resonating with the microwaves under the existence of the magnetic field. After being sufficiently energized, the nonproductive gas is supplied to the reaction space 1, for example, as energized electrons 21 and excited argon atoms 21 through space 30 and mesh grid 30'. Above the grid 20 are installed a plurality of ring-shaped nozzles 17 from which productive gas 22 is introduced into the nonproductive gas flow. The productive gas is excited and made active under interaction with the nonproductive gas. Further, the electric field between the pair of grids 20 and 20' is applied which causes glow discharge in the reaction chamber.

According to experiments, the nonproductive gas remains active after entering into the reaction space even if the reaction space is located rather distant from the resonating space, the distance being 5 to 20 cm for example. Unlike this configuration, a resonating space and a substrate to be treated are generally spaced from each other by 1 to 4 cm according to existing CVD apparatuses with cyclotron resonance which tend to produce uneven layers.

In addition, the pressure of the reaction chamber and the resonating space is maintained at 1 to $10^{-4}$ torr, more preferably 0.03 to 0.001 torr so that the productive gas spreads throughout the reaction space. The control is established with a control valve 14 of an exhaust system 11 which includes valve 15 and which adjusts the exhausting rate of a vacuum pump 9 in cooperation with a turbo molecular pump as a subordinate pump.

Also the nonproductive gas is supplied to the reaction space 1 through a homogenizer grid 20' so as to function as an homogenizer uniformly spread the nonproductive gas throughout the reaction space 1. The grid 20' functions also to prevent the active gas from flowing back to the resonating space 2. The nozzles 17 for the productive gas 22 are located in the downstream side of the grid 20'. In this configuration, the productive gas and the argon gas are sufficiently mixed with each other throughout a substantially broad area parallel with the substrate 10. The uniform flow of the reactant gas composed of the productive gas and the nonproductive gas produce a deposition of a layer having uniform thickness.

The pressure of the resonating and reaction spaces is chosen $1-10^{-4}$ torr, more preferably 0.03–0.001 torr in order to carry out the resonance and to help the active gas to spread easily in the chambers.

The nonproductive gas will keep its active energy even after traveling a path, normally of 20–80 cm, from the resonating space to the reaction space 1. In the case of ECR CVD, the path is only 1–4 cm which may be a cause of non-uniformity in thickness of a layer. Interference between the homogenizer 20' and the flow of the nonproductive gas is inevitable by which the energy of the nonproductive gas is wasted. Consequently, the growth rate tends to be reduced. Because of this, the homogenizer 20 may be prepared separately from the electrode. Namely, the homogenizer 20 can be made of a perforated quartz pane and a rough grid having 5 cm×5 cm mesh is disposed just below the pane. However, in the case where a high growth rate is desired rather than uniformity of deposition, the homogenizer may be removed. Unnecessary or redundant gas is discarded through the exhaust system 11. On the exhaust side, a buffer space 8 is provided also to help make the gas flow uniform.

Experiment 1

This experiment was made to deposit an amorphous silicon layer on a substrate according to the first embodiment of the invention.

As a nonproductive gas, argon gas was supplied to the resonating space 2 through the conduit 18 at a rate of 50 cc/min. The microwave oscillator 3 was adjusted to produce microwaves of 2.45 GHz with power supply of 200 W, the power supply being appropriate as long as chosen between 30 to 500 in general. The density of the magnetic field was 875 Gauss. On the other hand, monosilane gas was introduced at 20 cc/min into the reaction space 1 in which the total pressure was maintained at 0.003 torr.

On substrates of glass panes, which are coated with conductive transparent films, an amorphous silicon semiconductor layer is deposited as nonmonocrystalline semiconductors. Unnecessary gas was being exhausted through the exhaust system 11. As a product, a layer was formed at a deposition speed of 45 Å/sec on the substrate 10 of which the temperature is maintained at a temperature of 250° C. This speed is 30 times as high as obtained by a known plasma CVD alone (1.5 Å/sec). As to uniformity of the thickness of the layer, only a 10% fluctuation was observed even on a layer 1 micron thick having an area, 30 cm long×30 cm wide.

Then, electrical characteristics of this amorphous silicon layer were obtained. The dark conductivity was $2\times10^{-10}$ SCM$^{-1}$. The photo conductivity was $7\times10^{-5}$ under irradiation of light with a power supply 100 mW/cm$^2$ (AM1). The figures are not worse than obtained so far by a known plasma CVD. When the amorphous silicon layer was a solar cell having p-i-n junction, a high conversion efficiency was obtained.

Further, a semiconductor layer was deposited to a 1 microns thickness. On the layer were observed a number of pinholes of 0.1 to 0.001 microns in diameter. The number of the pinholes has been substantially reduced by a factor of 10 compared with prior art systems/processes. According to the invention, only 1 to 3 pinholes were found on a view of dark field with an electron microscope adjusted at magnification of 100.

When disilane gas or mixture of monosilane gas and silane fluoride is introduced into the reaction space in place of monosilane alone, the deposition speed was further increased.

Experiment 2

This experiment was made to demonstrate a deposition of a silicon oxide layer with a system of the first embodiment.

As nonproductive gases, argon gas and oxygen gas were supplied to the resonating space 2 through the conduit 18 at a rate of 50 cc/min with respect to each gas. The microwave oscillator 3 was adjusted to produce microwaves of 2.45 GHz with power supply of 200 W, the power supply being appropriate between 30 to 500 in general to generate microwaves. The density of the magnetic field was 875 Gauss. On the other hand, monosilane gas was introduced at 20 cc/min into the reaction space 1 in which the pressure was maintained at 0.003 torr.

On a silicon substrate was deposited silicon oxide or borosilicate or phosphosilicate-glass boro- or phospho-glass which is silicon oxide doped with phosphorus or boron. Unnecessary gas was being exhausted through an exhaust system 11. As a product, a layer was formed at a depositing speed of 45 Å/sec on the substrate 10 maintained at a temperature of 250° C. This speed is 30 times as high as obtained by a known plasma CVD alone, 1.5 Å/sec. Even with an ECR CVD alone such a high speed cannot be attained.

Prior to the invention, there have been observed a large number of silicon clusters, which are groups of silicon atoms failing to form crystal, with 0.01 to 0.001 microns in width. According to the invention, however, entirely no cluster was observed even with a transmission electron microscope. The breakdown electric field is $6 \times 10^6$ V/cm in case of insulation 1000 Å thick layer, which is a 30% increase compared with conventional art.

When disilane gas or mixture of monosilane gas and silane fluoride is introduced into the reaction space in place of monosilane alone, the deposition speed was further increased.

Experiment 3

This experiment was made to form a silicon nitride layer in which ammonia gas was further supplied into the resonating space as a nonproductive gas besides argon gas and the other processes of this experiment is substantially same, as the the experiment 1. The ammonia gas was introduced 5 times as much as silane through the conduit 16 or 18.

Where the ammonia gas is introduced through the conduit 18, the ammonia gas may be the resonating gas instead of the argon gas. Alternatively, the ammonia gas is simply mixed with the argon gas which alone is the resonating gas. However, argon gas is more appropriate for the resonating gas than ammonia gas. Even if only argon gas is the resonating gas, the ammonia molecules collide with the excited argon atoms and then made sufficiently active in the resonating space 2.

Accordingly, a mixture composed of disilane gas and ammonia gas was completely made active and introduced into the reaction space 1. Mixture of silicon fluoride, nitrogen and hydrogen may be used instead of said mixture. Further deposition were made respectively using monosilane, silicon fluoride or disilane gas introduced as a productive gas into the reaction space. The amount of each gas and the pressure in the reaction space 1 was the same as that of experiment 1. As a result, silicon nitride layers were obtained to the three process gases respectively with 12 Å/sec, 18 Å/sec and 18 Å/sec in thickness. These deposition speeds are about ten times as high as obtained by a known plasma CVD in which a silicon nitride layer is deposited normally at a rate of 1.5 Å/sec.

The silicon nitride layers 30 cm wide and 30 cm long on an n-type substrate having impurity density of $4 \times 10^{15}$ atom/$cm^3$ had respectively $8 \times 10^{11}$ $cm^{-2}$, $9 \times 10^{11}$ $cm^{-2}$ and $8 \times 10^{11}$ $cm^{-2}$ in surface level density which are less than ⅓ of a normal prior art value, $1.5 \times 10^{12}$ and substantially the same as that obtained by an ECR deposition method alone, $8 \times 10^{11}$. The improved uniformity of the layer was also obtained in which the fluctuation in thickness was less than 10% and the differences in physical property on the layer were not applicable.

To reduce the surface level density further, a two step deposition method may be adapted. Namely, at first, a silicon nitride layer is deposited by a photo CVD with 50 to 200 Å in thickness, then subsequently another silicon nitride layer is deposited, superimposed on the previously deposited layer, by an ECR CVD with the resonating space being supplied with microwaves.

Experiment 4

This experiment demonstrated another deposition of a silicon oxide layer. The process is substantially the same as that of the previous experiment except as particularly stated in the following discussion. The nonproductive gas was dinitrogen monoxide gas diluted with nitrogen instead of ammonia gas. The pressure in the reaction space 1 was $1 \times 10^{-3}$ torr under which overoxidation was prevented. The productive gas was monosilane ($SiH_4$) gas or chlorosilane ($SiH_2Cl_2$). The deposition rate was 40 Å/sec. The layer was observed also on a depressed portion as in the previous experiment.

Experiment 5

This experiment is for depositing a titanium nitride layer. In this experiment, the process is similar to that of the experiment 3 so that only modifications and differences will be described and redundant portions will not be repeated.

Instead of silane gas, titanium tetrachloride gas is introduced into the reaction chamber. The pressure in the reaction chamber is $1 \times 10^{-3}$ torr. As a product, a titanium nitride layer was deposited at 40 Å/sec, the layer being deposited also on a depression as in the experiment 3. The titanium nitride is advantageous when applied to a passivation film for enhancing the mechanical strength of a metal tool.

Experiment 6

This experiment is for depositing an aluminum nitride layer. In this experiment, the process is similar to that of experiment 3 so that only modifications and differences will be described and redundant portions will not be repeated.

Methylaluminum (Al(CH$_3$)$_3$ was introduced as the productive gas through the conduit 16 and the nozzle 17. As the nonproductive gas, argon gas was supplied through the conduit 18 together with argon gas. As a result, an aluminum layer 4000 Å thick was obtained after deposition had been carried out for 30 minutes.

Aluminum nitride is advantageous when used as a passivation film due to its high thermal conductivity. General properties of the AlN thus formed was similar to that of silicon nitride layer.

Figure 2:
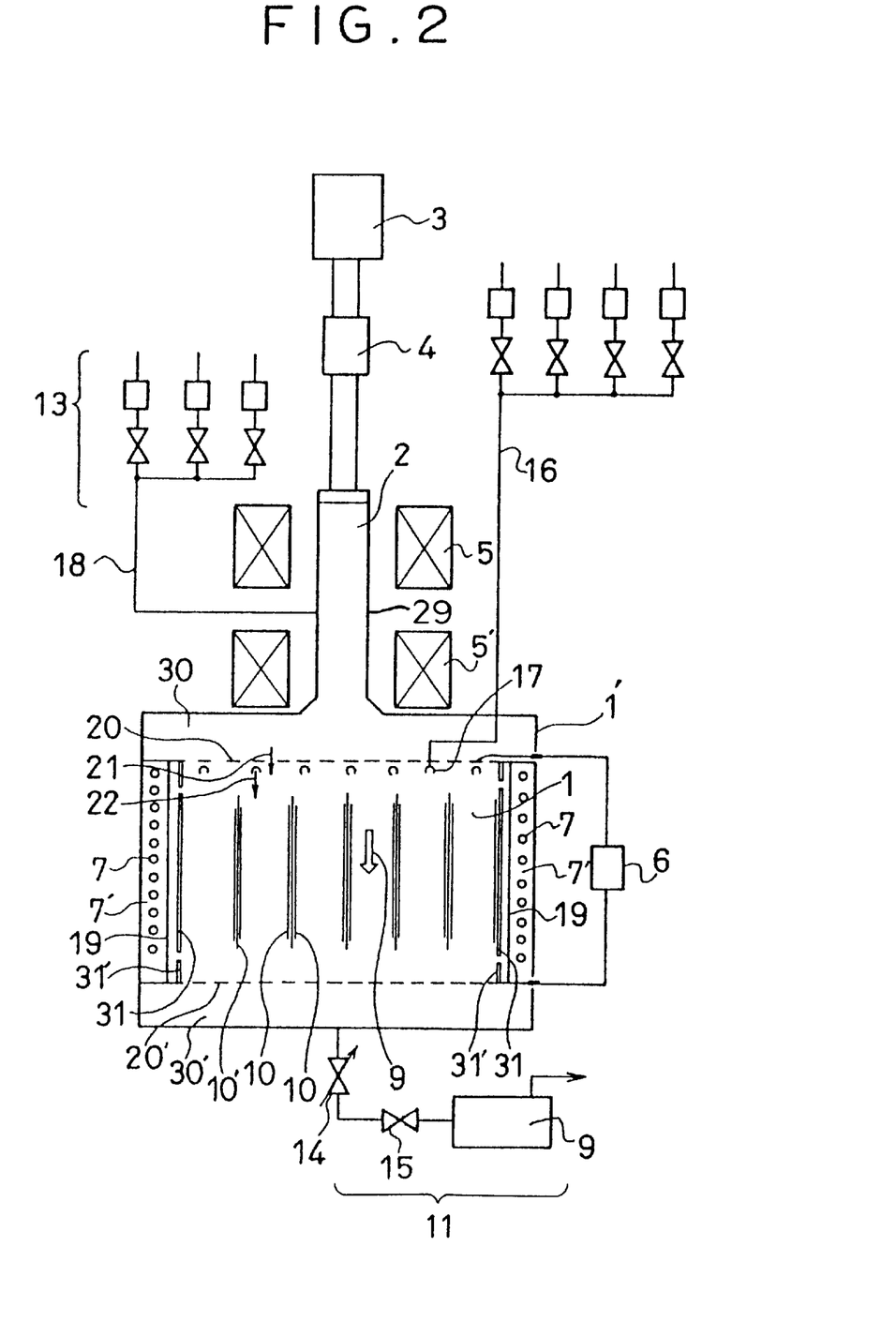
FIG. 2 is a side elevational, partially sectioned view showing a second embodiment on the invention.

Referring to FIG. 2, a second embodiment of the invention is shown. In the figure, a reaction chamber 1' made of stainless steel is accompanied by a loading chamber and an unloading chahber on the front side and rear side both not shown in the figure. In the reaction chamber 1' adjacent to the loading and unloading chamber is formed a reaction space from which no productive gas is leaked by the air tight structure confined by walls of a stainless steel or an insulating material. More exactly, the reaction space is defined between a pair of homogenizers 20 and 20' through which a productive gas is made uniform. A plurality of substrates 10 are fixed to the opposed surfaces of holders 10' which are vertically arranged in the reaction space 1.

In this embodiment, ten samples of the substrates 10 are attached to the five holder 10'. On both sides of the reactive chamber 1' are provided heaters 7', each being composed of a plurality of halogen lamps 7 from which ultraviolet light is emitted to irradiate the substrates 10 and the inside of the reaction chamber 1' through artificial quartz windows 19 and transparent walls 31 and 31'. Further, the homogenizers 20 and 20' function as a pair of electrodes which are supplied with voltage of 13.56 GHz or DC from a power source 6 and establish electric field in the reaction space therebetween. As shown in the figure, the substrates 10 are aligned parallel with the applied electric field. In the alternative, the electrodes may be located as opposing to each other also with respect to the direction normal to the drawing.

Nonproductive gas is supplied from a doping system 13 to a cylinder 29 made of artificial quartz defining a resonating space therein. Magnetic field is applied to the resonating space 2 by means of coreless coils 5, 5' provided around the cylinder 29. Simultaneously, microwaves of 2.45 GHz are radiated into the resonating space 2 from a microwave oscillator 3 through an isolator 4. In the same manner as the first embodiment, argon gas is excited and let enter the reaction space 1 through the homogenizer 20 as energized electrons 21 and excited argon atoms 21' through space 30.

The deposition process is substantially the same as that of the first example so that explanation of the process is dispensed with.

Experiment 7

This experiment was made to deposit an amorphous silicon layer on a substrate according to the second embodiment of the invention.

The reaction chamber 1' has a reaction space 25 cm high, 40 cm wide and 40 cm long. One batch is composed of ten substrates, each being 20 cm wide and 30 cm long. The pressure of the reaction space was 0.003 torr. Supplied to the resonating space 2 were argon gas as a nonproductive gas at a rate of 200 cc/min and monosilane at 80 cc/min. The microwave oscillator emitted microwaves of 2.45 GHz at a power of 200 to 800 W, that is 400 W, for example. The power supply outputs high frequency electric power at 40 W. The density of the magnetic field was adjusted 875±100 Gauss.

On substrates of glass panes which are coated with conductive transparent film, amorphous silicon semiconductor layers were deposited as nonmonocrystalline semiconductors. Unnecessary gas was being exhausted through an exhaust system 11 which includes control valve 14, valve 15, and vacuum pump 9. As a product, a layer was formed at a depositing speed of 45 Å/sec on the substrate 10 which is maintained at a temperature of 250° C. This speed is 30 times as high as obtained by a known plasma CVD alone, 1.5 Å/sec.

Then, electrical characteristics of the amorphous silicon layer were measured. The dark conductivity was $4 \times 10^{-10}$ SCM$^{-1}$. The photo-conductivity was $6 \times 10^{-5}$ under irradiation of 100 mW/cm$^2$ (AM1). The figures are not worse than obtained so far by a known plasma CVD. When the amorphous silicon layer was used to be incorporated with a solar cell having p-i-n junction, a high conversion efficiency was observed.

Next description is directed to how the amorphous silicon is applied for a solar cell. First a p-type semiconductor layer is formed on a substrate by a known flow discharge method. Then, an intrinsic semiconductor is superimposed on the p-type layer by ECR CVD of the invention. Lastly, an n-type semiconductor is deposited according to the invention.

Alternatively, a multichamber system may be employed for manufacturing solar cells. In the case, one or more chambers are configured of ECR plasma CVD. After placing in a load chamber, a supporting frame on which a plurality of substrates are disposed, the substrates are transported together with the frame to a first reaction chamber in which is made a deposition of a p-type semiconductor (SixC$_{1-x}$) layer with 100 to 200 Å in thickness. Next, the frame with the substrates is transported into a second reaction chamber as shown in FIG. 2 in which an intrinsic layer is deposited by a ECR CVD according to the invention. Further, the frame is transported into a third chamber in which an n-type crystalline semiconductor is deposited according to the invention. Namely, the invention is applied to deposition of intrinsic and crystalline semiconductors.

On the layer formed by a glow discharge deposition have been observed a number of pinholes with 0.1 to 0.01 microns. The number of the pinholes was substantially reduced by a factor of 10 compared with the prior art. According to the invention, only 1 to 3 pinholes were counted in one-,view of dark field with an electron microscope adjusted at magnification of 100.

When disilane gas or a mixture of monosilane gas and silane fluoride is introduced into the reaction space in place of monosilane alone, the deposition speed was further increased.

Experiment 8

This experiment was made to form a silicon nitride layer in which ammonia gas was supplied as a nonproductive gas in addition to the processing configuration of the experiment 7. The ammonia gas was introduced 5 times as much as silane gas through the conduit 16 or 18.

In case that the ammonia gas is introduced through the conduit 18, the ammonia gas may be used as the resonating gas instead of argon gas. Alternatively, the ammonia gas is simply mixed with argon gas which alone is the resonating gas. However, argon gas is more appropriate for the resonating gas than ammonia gas. Even if argon gas is the resonating gas and ammonia gas is not, the ammonia molecules collide with the excited argon gas atoms and are made active sufficiently in the resonating space 2.

Accordingly, the mixture composed of disilane gas and ammonia gas was completely made active and introduced into the reaction space 1. Mixture of silicon fluoride, nitrogen and hydrogen may be used instead of said mixture. Further deposition were carried out using monosilane, silicon respectively, fluoride or disilane gas introduced as a productive gas into the reactive space. The amount of each gas and the pressure in the reaction space 1 was the same as that of experiment 1. As a result, silicon nitride layers were obtained to the three process gases respectively with 12 Å/sec, 18 Å/sec and 18 Å/sec in thickness. These deposition speeds are about ten times as high as obtained by a known plasma CVD in which a silicon nitride layer is deposited normally at a rate of 1.5 Å/sec.

To reduce the surface level density further, a two step deposition method may be adapted. Namely, at first, a silicon nitride layer is deposited by a photo CVD with 50 to 200 Å in thickness, then subsequently another silicon nitride layer is deposited, superimposed on the previously deposited layer, by an ECR CVD with the resonating space being supplied with microwaves.

Experiment 9

This experiment demonstrated another deposition of a silicon oxide layer. The process is substantially the same as that of the previous experiment except as particularly stated in the following discussion. The nonproductive gas was dinitrogen monoxide gas diluted with nitrogen instead of ammonia gas. The pressure in the reaction space 1 was $1 \times 10^{-3}$ torr under which overoxidation was prevented. The productive gas was monosilane ($SiH_4$) gas or chlorosilane ($SiH_2Cl_2$). The deposition rate was 40 Å/sec. The layer was observed also on a depressed portion as in the previous experiment.

Experiment 10

This experiment relates to a deposition of titanium nitride. The process was carried out in the same manner as that of experiment 8 so that the disclosure will be made for only different procedures from that of experiment 8 and redundant-explanations will not be repeated.

In this experiment, titanium chloride diluted with nitrogen gas was introduced to the reaction space 1 from the nozzles 17 through the conduit 16. Also a mixture of nitrogen and hydrogen gases was introduced into the resonating space 2 together with argon gas. As a result, a titanium nitride layer with 4000 Å in thickness was deposited by deposition process for 10 minutes.

The titanium nitride layer is advantageous in abrasion resistance. Luster of the layer obtained according to the invention was evaluated equivalent to that obtained by prior arts.

Figure 3:
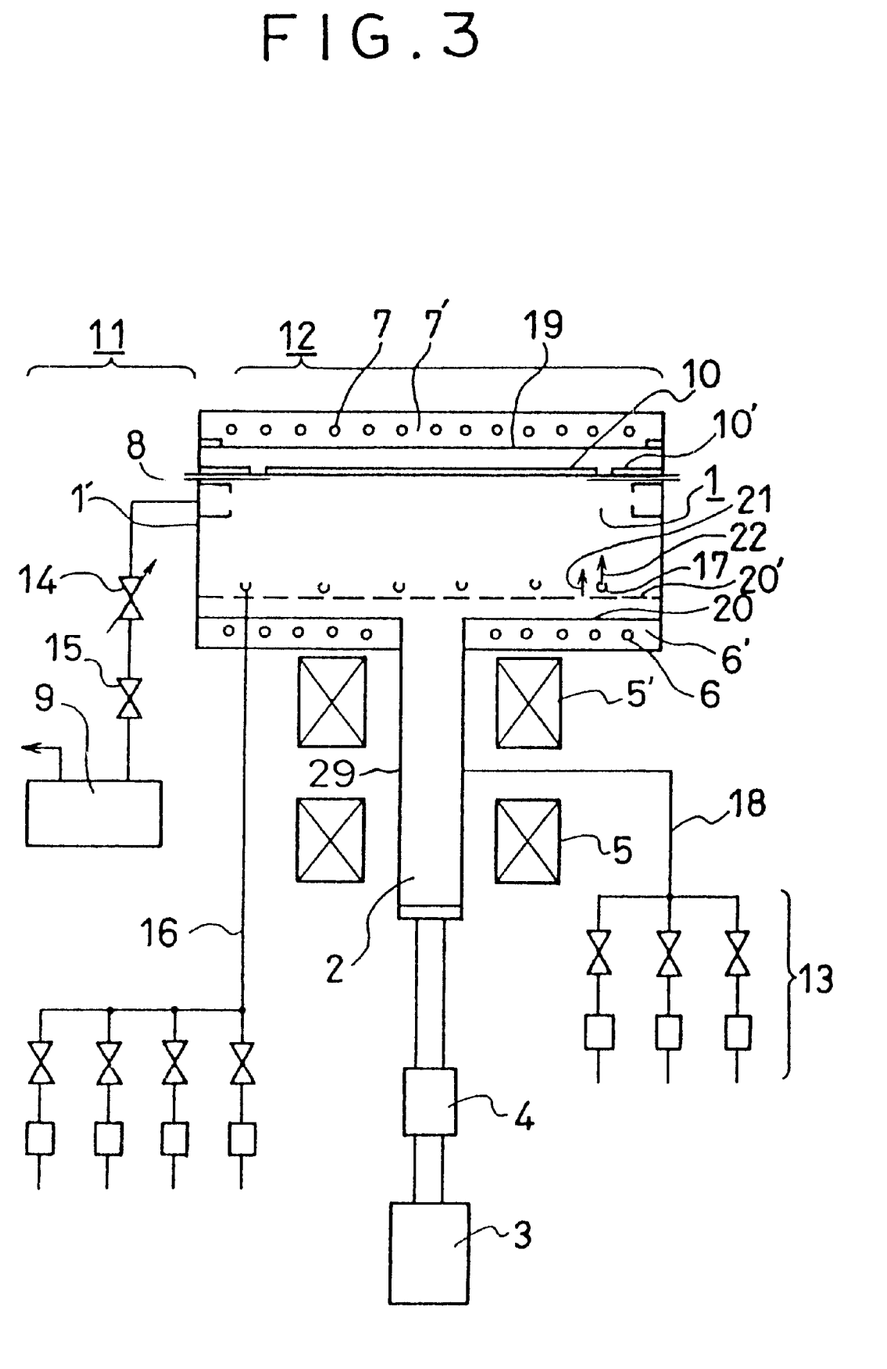
FIG. 3 is a side elevational, partial view showing a third embodiment on the invention.

Referring now to FIG. 3, a photo enhanced CVD system of cyclotron resonance type is illustrated to show a third embodiment.

In the figure, a reaction chamber 1' made of stainless steel constitutes a reaction space 1 therein. On the top of the reaction chamber 1' is provided a heater 7' which is equipped with a plurality of halogen lamps 7. The opposed side walls of the reaction chamber are formed with holders 10' by which a substrate 10 is supported just below the heater 7'. The substrate 10 is heated with infrared radiation emitted from the halogen lamps 7' through a window 19 made of artificial quartz. On the bottom of the chamber 1, a light source chamber 6' is provided with a plurality of low pressure mercury lamps 6. The bottom side of the substrate 10 in turn is irradiated with ultraviolet light emitted from the mercury lamps 6 in the light source 6' through a light window made of artificial quartz which has a high transmissivity in a range of short wave length. The low pressure lamps are prepared to irradiate the substrate 10 at more than 5 mW/cm$^2$, preferably at 10–100 mW/cm$^2$ with 185 nm in wave length.

On the other hand, nonproductive gas is introduced from a doping system into a resonating cavity 2 made of artificial quartz through a conduit 18. The resonating cavity 2 is provided with core-less coils 5 and 5' by which in the inside of the cavity is magnetic field. Further, the resonating cavity is supplied with microwave 2.45 GHz from an oscillator 3 through an isolator 4. The density of the magnetic field and the frequency of the microwave are determined consistently according to the molecular weight of the atom of the nonproductive gas. If argon gas is employed as the nonproductive gas, the magnetic field may be of 875 Gauss. The frequency of the microwave for the argon gas is automatically computed.

By virtue of the magnetic field, the nonproductive atoms resonate to the microwave and energy thereof increase, being pinched in the cavity. Then the excited nonproductive gas is supplied into the reaction space 1 through a partition 20' in the form of a homogenizer. Also a productive gas is leaked to the reaction space 1 from the doping system through ring shaped nozzles 17. As a result, the productive gas is excited by the excited nonproductive gas. Further, the productive gas is imparted with energy through irradiation of the ultraviolet light.

According to experiments, the nonproductive gas remains active in the reaction space even where the reaction space is located rather distant from the resonating space, the distance being 5 to 20 cm for example. Unlike this configuration, a resonation space and a substrate to be treated is 1 to 4 cm in general according to broadly used existing CVD apparatuses with cyclotron resonance which tend to produce uneven layers.

In addition, the pressure of the reaction chamber and the resonation space is controlled at 1 to $10^{-4}$ torr, more preferably 0.03 to 0.001 torr so that the productive gas can easily spread throughout the reaction space. The pressure control is established with a control valve 14 of an exhaust system 11 which adjusts the exhausting rate of a vacuum pump 9 in cooperation with a turbo molecular pump as a subordinate pump not shown in the figure.

Also the nonproductive gas is supplied to the reaction space 1 through a homogenizer 20' so as to spread throughout the reaction space 1'. The nozzles 17 for the productive gas are located in the downstream of the supplied productive gas as seen from the homogenizer. In the configuration, the productive gas and the argon gas are sufficiently mixed with each other throughout a substantially broad plane parallel with the substrate 10. The uniform flow of the reactant gas composed of the productive gas and the nonproductive gas, in turn, produce a deposition of a layer having uniform thickness.

Needless to say, interference between the homogenizer 20' and the flow of the nonproductive gas is inevitable by which the energy of the nonproductive gas is consumed. Consequently, the growth rate tends to be reduced. Because of this, in cases where high growth rate is desired rather than uniformity of deposition, the homogenizer may be removed. Unnecessary or redundant gas is discarded through the exhaust system 11.

Experiment 11

This experiment was made according to the third embodiment of the invention to deposit an amorphous silicon layer.

In this experiment, argon gas was supplied to the reaction space as the nonproductive gas at 50 cc/min whereas monosilane gas was introduced at 20 cc/min, simultaneously mixing therewith. The pressure in the reaction chamber was maintained at 0.002 torr. The ultraviolet irradiation is made with low pressure mercury lamps at 185 nm in wave length. The frequency of the microwaves was 2.45 GHz which was adjusted with power supply of 30 to 500 W, preferably the adjustment being done with power supply of 30 to 200 W. In correspondence with these microwaves, the density of the magnetic field was chosen to be 875 Gauss.

The amorphous silicon layer was deposited on a glass substrate which was coated with a conductive transparent film. During depositing amorphous silicon as a nonmonocrystalline silicon, unnecessary gas was exhausted through the exhaust system. As a result, the deposition rate was 13 Å/sec at 250° C. This rate is 40 times as high as attained by a photo CVD. The surface of the transparent film has a texture structure, uneven surface. The deposition was made also on the uneven surface.

The dark conductivity of the amorphous silicon layer thus formed was $3 \times 10^{-10}$ Scm$^{-1}$. The photo conductivity of the amorphous silicon layer was $6 \times 10^{-5}$ Scm$^{-1}$ with reference to light of AM1 (100 mW/cm$^{-1}$). These figures are substantially equivalent to that attained with an existing amorphous solar cell. The amorphous solar cell equipped with the amorphous layer according to the invention has a conversion efficiency no less than attained by the prior art.

Further, on the semiconductor layer deposited to a 1 micron thickness were observed a number of pinholes of 0.1 to 0.001 microns in diameter. The number of the pinholes was substantially reduced by a factor of 10 compared with the prior art. According to the invention, only 1 to 3 pinholes were picked up on a view of dark field with an electron microscope adjusted at a magnification of 100.

When disilane gas or mixture of monosilane gas and silane fluoride is introduced into the reaction space in place of monosilane alone, the deposition speed was further increased.

Experiment 12

This experiment was made to form a silicon nitride layer in which ammonia gas was further supplied into the resonating space as a nonproductive gas besides argon gas and the other process of this experiment is substantially the same as experiment 11. The ammonia gas was introduced 5 times as much as silane through the conduit 16 or 18.

In case that the ammonia gas is introduced through the conduit 18, the ammonia gas may be resonating gas instead of argon gas. Alternatively, the ammonia gas is simply mixed with argon gas which alone is the resonating gas. However, argon gas is more appropriate for the resonating gas than ammonia gas. Even if only argon gas is resonating gas, the ammonia molecules collide with the excited argon gas atoms and then made active sufficiently in the resonating space 2.

Accordingly, mixture composed of disilane gas and ammonia gas was completely made active and introduced into the reaction space 1. Mixture of silicon fluoride, nitrogen and hydrogen may be used instead of said mixture. Further deposition were made respectively using monosilane, silicon fluoride or disilane gas introduced as a productive gas into the reaction space. The amount of gas and the pressure in the reaction space 1 was the same as that of experiment 1. As a result, silicon nitride layers were obtained to the three process gases respectively with 12 Å/sec, 18 Å/sec and 18 Å/sec in thickness. These deposition speeds are about ten times as high as obtained by a known plasma CVD in which a silicon nitride layer is deposited normally at a rate of 1.5 Å/sec.

The silicon nitride layers 30 cm wide and 30 cm long on an n-type substrate having impurity density of $4 \times 10^{15}$ atom/cm$^3$ had respectively $8 \times 10^{11}$ cm$^{-2}$, $9 \times 10^{11}$ cm$^{-2}$ in surface level density which are less than ⅓ of a normal prior art value, $1.5 \times 10^{12}$ and substantially same as that obtained by ECR deposition method alone, $8 \times 10^{11}$. The improved uniformity of the layer was also obtained in which the fluctuation in thickness was less than 10% and the differences in physical property on the layer were not applicable.

To reduce the surface level density further, a two step deposition method may be adapted. Namely, at first, a silicon nitride layer is deposited by a photo CVD with 50 to 200 Å in thickness, then subsequently another silicon nitride layer is deposited, superimposed on the previously deposited layer, by an ECR CVD with the resonating space being supplied with microwaves.

This experiment was made to form a silicon nitride layer in which ammonia gas was supplied as a nonproductive gas in addition to the configuration of the experiment 10. The ammonia gas was introduced 5 times as much as silane through the conduit 16 or 18.

In case that the ammonia gas is introduced through the conduit 18, the ammonia gas may be resonating gas instead of argon gas. Alternatively, the ammonia gas is simply mixed with argon gas which alone is the resonating gas. However, argon gas is more appropriate for the resonating gas. Even if argon gas is the resonating gas, the ammonia molecules collide with the excited argon gas atoms and made active sufficiently in the resonating space 2.

Accordingly, a mixture composed of disilane gas and ammonia gas was completely made active and introduced into the reaction space 1. Mixture of silicon fluoride, nitrogen and hydrogen may be used instead of said mixture. Further, monosilane, silicon fluoride or disilane gases are introduced as a productive gas into the reaction space. The content of each gas and the pressure in the reaction space 1 was the same as that of experiment 10. As a result, silicon nitride layers were obtained to the three process gases respectively with 12 Å/sec, 18 Å/sec and 18 Å/sec. These deposition speeds are more than twenty times as high as obtained by a photo enhanced CVD in which a silicon nitride layer is deposited normally at a rate of 0.3 Å/sec.

The silicon nitride layers on an n-type substrate having impurity density of $4 \times 10^{15}$ atom/cm$^3$ had respectively $2 \times 10^{11}$ cm$^{-2}$, $2.5 \times 10^{11}$ cm$^{-2}$ and $2.5 \times 10^{11}$ cm$^{-2}$ in surface level density which, although the figures are larger than that obtained by a prior art photo enhanced CVD, they are less that ⅐ of that obtained by a normal prior art plasma CVD and less than ¼ of that obtained by a CVD with cyclotron resonance.

To reduce the surface level density further, a two step deposition method may be adapted. Namely, at first, a silicon nitride layer is deposited by a photo CVD with 50 to 200 Å in thickness, then subsequently another silicon nitride layer is deposited, superimposed on the previously deposited layer, by an ECR CVD with the resonating space being supplied with microwaves.

Also a deposition of silicon nitride was carried out on a substrate having a trench 1.5 wide and 4 microns deep. The deposition was designed to form a layer 0.3 microns thick. A silicon nitride layer was obtained on the trench with 0.3 microns in thickness.

Experiment 13

This experiment demonstrated another deposition of a silicon oxide layer. The process is substantially the same as that of the previous experiment except as particularly stated in the following discussion. The nonproductive gas was dinitrogen monooxide gas diluted with nitrogen instead of ammonia gas. The pressure in the reaction space 1 was $1 \times 10^{-3}$ torr under which overoxidation was prevented. The productive gas was monosilane ($SiH_4$) gas or chlorosilane ($SiH_2Cl_2$). The deposition rate was 20 Å/sec. The layer was observed also on a depressed portion as in the previous experiment.

Experiment 14

This experiment is for depositing an aluminum nitride layer. In this experiment, the process is similar to that of the experiment 14 so that only modifications-and differences will be described and redundant portions will not be repeated.

Methylaluminum ($Al(CH_3)_3$) was introduced as the productive gas through the conduit 16 and the nozzle 17. As the nonproductive gas, argon gas was supplied through the conduit 18 together with argon gas. As a result, an aluminum nitride layer 700 Å thick was obtained after deposition for 10 minutes.

In this embodiment, the aluminum nitride shall not be an obstacle or ultraviolet light even if formed on the window 20 because the energy gap of aluminum nitride is 6 eV. This makes it possible to form a layer having a sufficient thickness for light reflection preventing film with a photo enhanced CVD alone.

Aluminum nitride is advantageous when used as a passivation film due to its high thermal conductivity. General property of the AlN thus formed was similar to that of silicon nitride layers.

While the invention has been particularly shown and described with reference to preferred embodiments thereof, it will be understood by those skilled in the art that the foregoing and other changes in form and details may be made therein without departing the spirit and scope of the invention, some examples being described as follows:

Prior to actual deposition of a layer, $NF_2$ gas, $H_2$ gas or $N_2$ gas may be introduced through the nozzle 17 shown in FIG. 3 to carry out photo cleaning of the surface of a substrate making the manufacturing reproducible. The photo cleaning can be made by active hydrogen atoms, also by active fluorine atoms or chlorine atoms. By virtue of the photo cleaning of fluorine or chlorine, oxide or other dust can be removed from the surface. Further, the photo cleaning forms a monoxide film on the surface which repels oxygen and water. This photo cleaning makes a deposited layer of high quality, because a deposition process is somewhat vulnerable to contamination of oil introduced from a exhaust system.

As a light source, eximer laser (100 to 400 nm in wave length), argon laser, nitrogen laser or so on are usable for the invention.

The substrate may be a glass pane, a stainless plate or silicon semiconductor substrate on which may be deposited III–V semiconductor compound such as GaAs, GaAlAs, InP, GaN etc As productive gas, $Al(CH_3)_3$, composition of $Si_2H_6$, $O_2$ and $PH_3$ (or $P_2H_6$), $Ga(CH_3)_3$ and $NH_3$, $Ga(CH_3)_3$ and $PH_3$, or $Al(CH_3)_3$) and $PH_3$ may be used respectively for deposition of Al, PSG, BSG, GaN, GaP or AlP with a photo enhanced CVD.

Instead of amorphous silicon semiconductor, amorphous semiconductor may be $SiGe_{1-x}$ (0<x<1), $SiO_{2-x}$ (0<x<2), $Si_xC_{1-x}$ (0<x<1), $Si_3N_{4-x}$ (0<x<4).

The present invention is advantageous also when applied to MIS type light emitting devices, FETs, super lattice devices, HEMT devices, semiconductor lasers, photo integrated circuits or so one.

Although the above description has been made, deposition system using perfect cyclotron resonances with properly adjusted magnetic field and corresponding tuned microwaves, a nonproductive gas can be sufficiently excited only by microwaves so that fast deposition speed is employed.

In accordance with the present invention, a plasma processing apparatus is provided as shown in the drawings, of the electric field applied to the substrate treatment chamber is perpendicular to the use surface of the substrate. In accordance with this feature, the reactive particles are accelerated by the electric field towards the substrate surface, thereby facilitating anisotropic etching or a deposition of a hard protective film such as diamond-like carbon, which requires a sputtering action during deposition. In addition in accordance with the present invention, the direction of the electric field can be provided parallel to the surface of the substrate, which is particularly advantageous when processing an object which is easily damaged by the plasma. In accordance with this feature, the reactive particles flow parallel to the surface of the substrate such that the surface does not react by a sputtering action from the plasma. Further, by the use of light passing through the plasma to reach the surface of the substrate in accordance with another feature of the invention, the present invention recognizes the importance in irradiating the substrate with light through the plasma in order to increase the process speed.

Further, although deposition processes have primarily been explained, the apparatus of the present invention is also applicable for etching processes simply by changing the reactive gas to an etchant gas. An example will be described below.

A silicon semiconductor is etched by using the apparatus shown in FIG. 1. A silicon substrate 10 having a non-single crystal semiconductor layer such as an amorphous silicon layer on its surface is placed in the treatment chamber 1. A photo resist pattern has been formed on the substrate as a mask pattern. As an etchant gas, a nitrogen fluoride gas is introduced into the plasma forming chamber 2 through the conduit 18. The etching is performed in accordance with the following condition:

microwave power (3): 2.45 GHz, 30–500 W, e.g. 200 W
high frequency power (6): 13.56 MHz The etching rate obtained in this embodiment is 15 Å which is three times as fast as that obtained in the conventional etching process. Also, the etching is an anisotropic etching by virtue of the electric field applied perpendicularly to the substrate.

Further, after the etching of the semiconductor, the remaining photoresist pattern can be effectively removed by plasma ashing using an oxygen plasma.

What is claimed is:
1. A plasma processing apparatus comprising:
a resonance chamber;

a gas introducing means for introducing a process gas into the resonance chamber;

a means for emitting a microwave into the resonance chamber;

a means for inducing a magnetic field in the resonance chamber to form an electron cyclotron resonance in order to convert said process gas to a plasma;

a reaction chamber connected above the resonance chamber wherein the plasma flows from the resonance chamber to the reaction chamber;

a substrate having a surface to be treated placed in the reaction chamber, wherein said substrate is supported within said reaction chamber above said resonance chamber; and exhaust means for exhausting said reaction chamber, wherein a port of said exhaust means is positioned within said reaction chamber between said substrate and said resonance chamber.

2. The apparatus of claim 1, wherein a frequency of said microwave is 2.45 GHz and a strength of said magnetic field is 875 Gauss.

3. The apparatus of claim 1, wherein a light source emits light into said reaction chamber to further convert said process gas to said plasma.

4. The apparatus of claim 1, further comprising a control valve interposed between the reaction chamber and said port.

5. The apparatus of claim 4, wherein said exhaust means comprises a turbo-molecular pump.

6. A plasma processing apparatus comprising:

a plasma forming resonance chamber;

a gas introducing means for introducing a process gas into the plasma forming resonance chamber;

a means for emitting a microwave into the plasma forming resonance chamber;

a means for inducing a magnetic field in the plasma forming resonance chamber to form an electron cyclotron resonance in order to convert said process gas to a plasma;

an object treatment chamber adjoining the plasma forming resonance chamber above the plasma forming resonance chamber;

a single substrate having a surface to be treated placed in the object treatment chamber wherein said substrate is supported within said object treatment chamber above a single opening of said plasma forming resonance chamber;

exhaust means for exhausting said object treatment chamber, said exhaust means including a port positioned within said object treatment chamber between said substrate and said resonance chamber.

7. The apparatus of claim 6, wherein a frequency of said microwave is 2.45 GHz and a strength of said magnetic field is 875 Gauss.

8. The apparatus of claim 6, where a light source emits light into said object treatment chamber to further convert said process gas to said plasma.

9. The apparatus of claim 6, further comprising a control valve interposed between the object treatment chamber and said port.

10. The apparatus of claim 9, wherein said exhaust means comprises a turbo-molecular pump.

11. A plasma processing method comprising:

introducing a process gas into a plasma forming chamber;

emitting a microwave into the plasma forming chamber;

inducing a magnetic field in the plasma forming chamber to form an electron cyclotron resonance in order to convert said process gas to a plasma;

providing an object treatment chamber adjoining the plasma forming chamber wherein said object treatment chamber is positioned above said plasma forming chamber;

positioning a substrate having a surface to be treated in the object treatment chamber above said plasma forming chamber;

exhausting said treatment chamber with an exhaust means wherein a port of said exhaust means is positioned between said substrate and said plasma forming chamber.

12. The method of claim 11, wherein a frequency of said microwave is 2.45 GHz and a strength of said magnetic field is 875 Gauss.

13. The method of claim 11, including emitting light into said treatment chamber to further convert said process gas to said plasma.

14. The method of claim 11, wherein a layer is deposited on said substrate surface from said process gas.

15. The method of claim 11, wherein said substrate surface is etched by said process gas.

16. The method of claim 11, further comprising positioning a control valve interposed between the object treatment chamber and said port.

17. The method of claim 16, wherein said exhaust means comprises a turbo-molecular pump.

18. A plasma processing method comprising:

introducing a process gas into a plasma forming chamber;

emitting a microwave into the plasma forming chamber;

inducing a magnetic field in the plasma forming chamber to form an electron cyclotron resonance in order to convert said process gas to a plasma;

providing an object treatment chamber adjoining the plasma forming chamber wherein said object treatment chamber is positioned above said plasma forming chamber;

positioning a single substrate having a surface to be treated in the object treatment chamber wherein said substrate is supported within said object treatment chamber above a single opening of said plasma forming resonance chamber;

exhausting said treatment chamber with an exhaust means wherein a port of said exhaust means is positioned between said substrate and said plasma forming chamber.

19. The method according to claim 18 wherein said exhaust means comprises a turbo-molecular pump.

20. A plasma CVD apparatus:

a resonance chamber;

a means for emitting a microwave into the resonance chamber;

a means for inducing a magnetic field in the resonance chamber to form an electron cyclotron resonance in order to form a plasma;

a reaction chamber connected above the resonance chamber wherein the plasma flows from the resonance chamber to the reaction chamber;

a gas introducing means for introducing a reactive gas into said reaction chamber;

a substrate having a surface to be treated placed in the reaction chamber wherein said substrate is horizontally arranged so that said surface faces toward said resonance chamber; and exhaust means for exhausting said reaction chamber, wherein a port of said exhaust means is positioned within said reaction chamber between said substrate and said resonance chamber.

21. A plasma CVD apparatus:

a resonance chamber;

a means for emitting a microwave into the resonance chamber;

a means for inducing a magnetic field in the resonance chamber to form an electron cyclotron resonance in order to form a plasma;

a reaction chamber connected above the resonance chamber wherein the plasma flows from the resonance chamber to the reaction chamber;

a gas introducing means for introducing a reactive gas into said reaction chamber;

a single substrate having a surface to be treated placed in the reaction chamber wherein said substrate is arranged horizontally so that said surface faces toward a single opening of said resonance chamber; and exhaust means for exhausting said reaction chamber, wherein a port of said exhaust means is positioned within said reaction chamber between said substrate and said resonance chamber.

22. A plasma processing method comprising:

introducing a microwave into a resonance chamber;

inducing a magnetic field in the resonance chamber to form an electron cyclotron resonance in order to form a plasma;

providing a reaction chamber adjoining the resonance chamber wherein said reaction chamber is positioned above said resonance chamber;

introducing a reactive gas into said reaction chamber;

positioning a substrate having a surface in the reaction chamber wherein said substrate is horizontally arranged so that said surface faces toward said resonance chamber;

exhausting said reaction chamber with an exhaust means wherein a port of said exhaust means is positioned between said substrate and said resonance chamber; and depositing a film on the surface of said substrate by plasma CVD.

23. A plasma processing method comprising:

introducing a microwave into a resonance chamber;

inducing a magnetic field in the resonance chamber to form an electron cyclotron resonance in order to form a plasma;

providing a reaction chamber adjoining the resonance chamber wherein said reaction chamber is positioned above said resonance chamber;

introducing a reactive gas into said reaction chamber;

positioning a single substrate having a surface in the reaction chamber wherein said substrate is horizontally arranged so that said surface faces toward a single opening of said resonance chamber;

exhausting said reaction chamber with an exhaust means wherein a port of said exhaust means is positioned between said substrate and said resonance chamber; and depositing a film on the surface of said substrate by plasma CVD.

24. A plasma CVD apparatus:

a resonance chamber;

a means for emitting a microwave into the resonance chamber;

a means for inducing a magnetic field in the resonance chamber to form an electron cyclotron resonance in order to form a plasma;

a reaction chamber connected above the resonance chamber wherein said reaction chamber has a side wall which extends perpendicularly;

a gas introducing means for introducing a reactive gas into said reaction chamber;

a substrate having a surface to be treated placed in the reaction chamber wherein said substrate is horizontally arranged so that said surface faces toward said resonance chamber; and exhaust means for exhausting said reaction chamber, wherein a port of said exhaust means is positioned on the side wall of said reaction chamber between said substrate and said resonance chamber.

25. A plasma CVD apparatus:

a resonance chamber;

a means for emitting a microwave into the resonance chamber;

a means for inducing a magnetic field in the resonance chamber to form an electron cyclotron resonance in order to form a plasma;

a reaction chamber connected above the resonance chamber wherein said reaction chamber has a side wall which extends perpendicularly;

a gas introducing means for introducing a reactive gas into said reaction chamber;

a single substrate having a surface to be treated placed in the reaction chamber wherein said substrate is arranged horizontally so that said surface faces toward a single opening of said resonance chamber; and exhaust means for exhausting said reaction chamber, wherein a port of said exhaust means is positioned within said reaction chamber between said substrate and said resonance chamber.

26. An apparatus according to claim 20, 21, 24, or 25 wherein said exhaust means comprises a turbo-molecular pump.

27. An apparatus according to claim 20, 21, 24 or 25 wherein said reactive gas comprises a material selected from the group consisting of monosilane, disilane, $SiF_n(n \geq 2)$, $SiH_nF_{4-n}$ ($1 \leq n \leq 4$), $GeH_4$, $GeF_4$, $GeH_nF_{4-n}(n=1, 2, 3)$, $Al(CH_3)_3$, $Al(C_2H_5)_3$, $AlCl_3$, $Ga(CH_3)_3$, $Ga(C_2H_5)_3$, and $SiH_2Cl_2$.

28. A apparatus according to claim 20, 21, 24, or 25 further comprising a means for introducing a non-productive gas into said resonance chamber.

29. A plasma processing method comprising:

introducing a microwave into a resonance chamber;

inducing a magnetic field in the resonance chamber to form an electron cyclotron resonance in order to form a plasma;

providing a reaction chamber adjoining the resonance chamber wherein said reaction chamber is located above said resonance chamber and has a side wall which extends perpendicularly;

introducing a reactive gas into said reaction chamber;

positioning a substrate having a surface in the reaction chamber wherein said substrate is horizontally arranged so that said surface faces toward said resonance chamber;

exhausting said reaction chamber with an exhaust means wherein a port of said exhaust means is positioned on said side wall between said substrate and said resonance chamber; and depositing a film on the surface of said substrate by plasma CVD.

30. A plasma processing method comprising:

introducing a microwave into a resonance chamber;

inducing a magnetic field in the resonance chamber to form an electron cyclotron resonance in order to form a plasma;

providing a reaction chamber adjoining the resonance chamber wherein said reaction chamber is positioned above said resonance chamber and has a side wall which extends perpendicularly;

introducing a reactive gas into said reaction chamber;

positioning a single substrate having a surface in the reaction chamber wherein said substrate is horizontally arranged so that said surface faces toward a single opening of said resonance chamber;

exhausting said reaction chamber with an exhaust means wherein a port of said exhaust means is positioned on said side wall between said substrate and said resonance chamber; and depositing a film on the surface of said substrate by plasma CVD.

31. A method according to claim 22, 23, 29, or 30 wherein said exhaust means comprises a turbo-molecular pump.

32. A method according to claim 22, 23, 29, or 30 wherein said reactive gas comprises a material selected from the group consisting of monosilane, disilane, $SiF_n(n \geq 2)$, $SiH_nF_{4-n}$ ($1 \leq n \leq 4$), $GeH_4$, $GeF_4$, $GeH_nF_{4-n}$(n=1, 2, 3), $Al(CH_3)_3$, $Al(C_2H_5)_3$, $AlCl_3$, $Ga(CH_3)_3$, $Ga(C_2H_5)_3$, and $SiH_2Cl_2$.

33. A method according to claim 22, 23, 29 or 30 further comprising a step of introducing a non-productive gas into said resonance chamber.

34. A method according to claim 22, 23, 29 or 30 wherein said film comprises $Si_xC_{1-x}$ ($0<x<1$).

35. A method according to claim 22, 23, 29 or 30 wherein said film comprises $SiGe_{1-x}$ ($0<x<1$).

36. A method according to claim 22, 23, 29 or 30 wherein said film comprises $SiO_{2-x}$ ($0<x<2$).

37. A method according to claim 22, 23, 29 or 30 wherein said film comprises $Si_3N_{4-x}$ ($0<x<4$).

* * * * *